United States Patent
Liou et al.

(10) Patent No.: US 8,164,094 B2
(45) Date of Patent: Apr. 24, 2012

(54) PIXEL STRUCTURE AND FABRICATING METHOD THEREOF

(75) Inventors: Meng-Chi Liou, Taoyuan County (TW); Li-Hsuan Chen, Taipei County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 212 days.

(21) Appl. No.: 12/732,183

(22) Filed: Mar. 25, 2010

(65) Prior Publication Data
US 2011/0175093 A1    Jul. 21, 2011

(30) Foreign Application Priority Data
Jan. 15, 2010   (TW) .............................. 99200888 U (51) Int. Cl.
*H01L 29/04* (2006.01)
(52) U.S. Cl. ..... 257/59; 257/72; 257/258; 257/E21.535; 438/29
(58) Field of Classification Search .............. 257/59, 257/72, 258, E21.535; 438/29
See application file for complete search history.

(56) References Cited

U.S. PATENT DOCUMENTS
2004/0169991 A1*   9/2004   Nagata et al. .............. 361/301.1
* cited by examiner

*Primary Examiner* — Tan N Tran
(74) *Attorney, Agent, or Firm* — Jianq Chyun IP Office (57) ABSTRACT

In a fabricating method of a pixel structure, a scan line and a gate electrode are formed in each pixel area of a substrate. A gate insulation layer is formed to cover the scan line and gate electrode. A semiconductor layer is formed on the gate insulation layer above the gate electrode. A data line, source and drain are formed in each pixel area. A first passivation layer covers the data line, source and drain. A common line is formed on the first passivation layer and overlaps with at least a portion of the data line. A common electrode is formed on and electrically connected with the common line. A second passivation layer covers the common electrode and common line. A contact window is formed in the second passivation layer above the drain to expose the drain. A pixel electrode is electrically connected with the drain through the contact window.

19 Claims, 11 Drawing Sheets

PIXEL STRUCTURE AND FABRICATING METHOD THEREOF

CROSS-REFERENCE TO RELATED APPLICATION

This application claims the priority benefit of Taiwan application serial no. 99200888, filed Jan. 15, 2010. The entirety of the above-mentioned patent application is hereby incorporated by reference herein and made a part of specification.

BACKGROUND OF THE INVENTION

1. Field of Invention

The invention is related to a pixel structure and a fabricating method thereof, and is particularly related to a pixel structure having a high aperture ratio and favorable display quality and a fabricating method thereof.

2. Description of Related Art

With advantages of high definition, small size, light weight, low driving voltage, low power consumption, and an extensive range of applications, liquid crystal displays (LCD) have replaced cathode ray tube (CRT) displays and have become the mainstream among the latest generation of display products. A conventional liquid crystal panel is formed by a color filter substrate, a thin-film transistor array substrate, and a liquid crystal layer disposed between the foregoing two substrates. To improve display quality, various layout designs of pixel structures for liquid crystal panels have been proposed.

Figure 1:
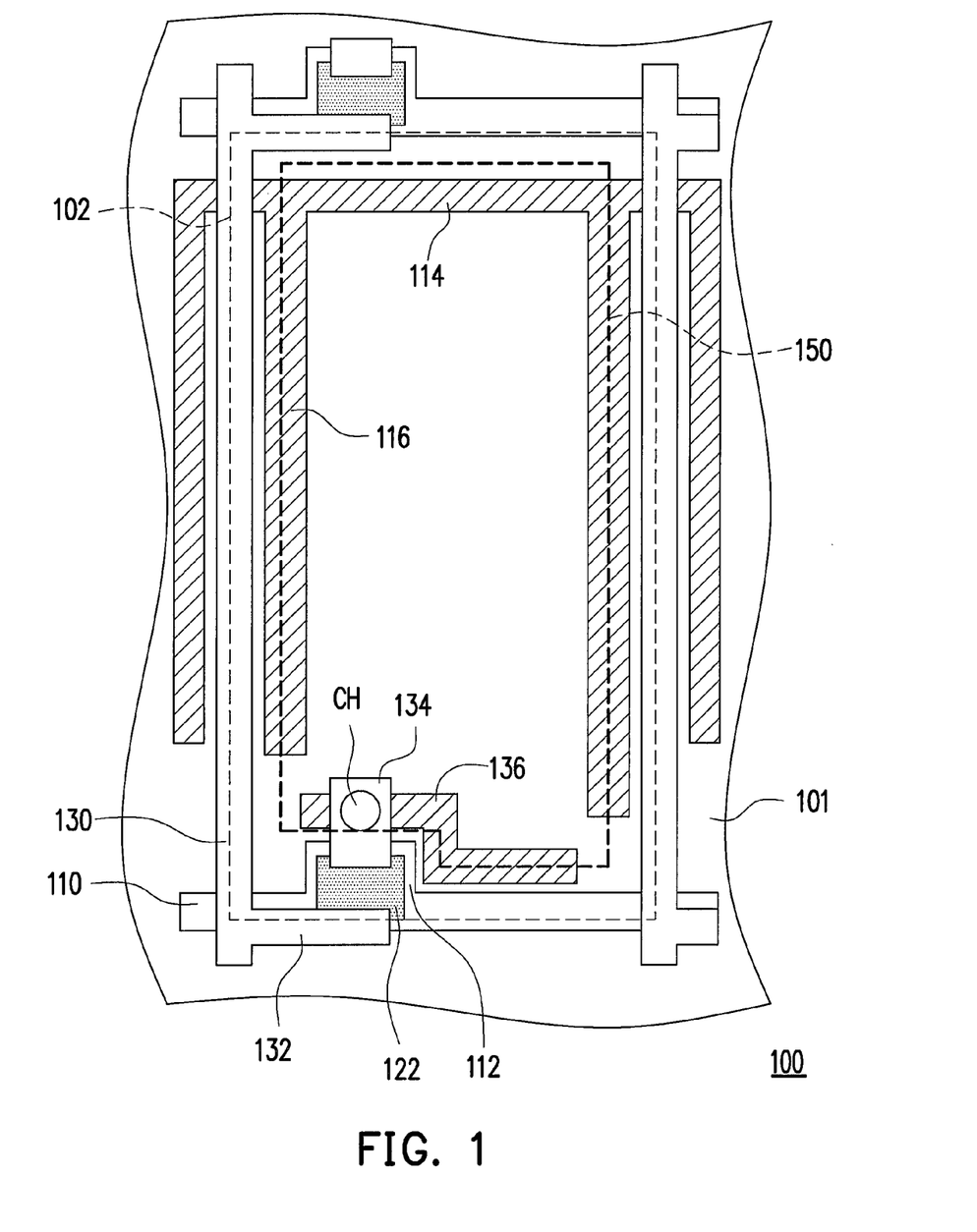
FIG. 1 is a schematic top view of a conventional pixel structure.

FIG. 1 is a schematic top view of a conventional pixel structure. Referring to FIG. 1, a substrate 101 has a plurality of pixel areas 102 arranged in an array, and a pixel structure 100 is disposed in each of the pixel areas 102. In the drawing, only one of the pixel areas 102 is depicted for convenience of description. The pixel structure 100 includes a scan line 110 and a gate electrode 112, a drain extension region 136 and common electrodes 114 and 116, a semiconductor layer 122, a data line 130, a source 132 and a drain 134, and a pixel electrode 150.

The pixel structure 100 is a thin-film transistor pixel structure fabricated by five conventional photomask processes. The conventional five photomask processes include a first photomask process for forming the scan line 110, the gate electrode 112, and the common electrodes 114 and 116, a second photomask process for forming the semiconductor layer 122, a third photomask process for forming the data line 130, the source 132, the drain extension region 136, and the drain 134; a fourth photomask process for forming a contact window CH above the drain 134 or above the drain extension region 136, and a fifth photomask process for forming the pixel electrode 150.

Because the scan line 110, the data line 130, the thin-film transistor (formed by the gate electrode 112, the source 132, the drain 134, and the drain extension region 136), and the common electrodes 114 and 116 in the pixel structure 100 are formed by opaque metal layers, the aperture ratio of the pixel structure 100 is reduced by these opaque metal layers. Although the common electrodes 114 and 116 are capable of increasing the storage capacitance of the pixel structure 100, the aperture ratio of the pixel structure 100 is lowered as the area occupied by the common electrodes 114 and 116 in each pixel area increases.

When the pixel structure 100 is applied in a high-resolution portable liquid crystal display device, such as a 2.4 inch QVGA (quarter video graphic array, 320×240) liquid crystal display, the space for each pixel area 102 is reduced. As a consequence, the aperture ratio of the pixel structure 100 is limited to about 53%, which is lower than the aperture ratios of general televisions or monitors. Therefore, to maintain the brightness of the pixel structure 100, it is necessary to add light sources in the display device, which is a waste of energy.

In addition, the common electrode 114 and the scan line 110 of the pixel structure 100 are formed on the substrate 101 at the same time. When the common electrode 114 and the scan line 110 are close to each other, a short circuit may easily occur between the common electrode 114 and the scan line 110, which reduces the production yield.

SUMMARY OF THE INVENTION

The invention provides a pixel structure having a higher aperture ratio and superb display quality.

The invention provides a fabricating method of a pixel structure and increasing production yield.

The present invention provides a fabricating method of a pixel structure. The fabricating method includes the following steps. First, a substrate having a plurality of pixel areas arranged in an array is provided. A scan line and a gate electrode are formed in each of the pixel areas. Then, a gate insulation layer is formed to cover the scan line and the gate electrode. A semiconductor layer is formed on the gate insulation layer above the gate electrode. Next, a data line, a source, and a drain are formed in each of the pixel areas. The source and the drain are formed on two sides of the semiconductor layer. A first passivation layer is formed on the substrate to cover the data line, the source, and the drain. A common line is formed on the first passivation layer, wherein the common line overlaps with at least a portion of the data line. A common electrode is formed on and electrically connected to the common line. A second passivation layer is formed to cover the common electrode and the common line. A contact window is formed in the second passivation layer above the drain to expose the drain. Afterwards, a pixel electrode is formed in each of the pixel areas, and the pixel electrode is electrically connected with the drain through the contact window.

According to an embodiment of the invention, the common electrode surrounds the periphery of each of the pixel areas.

According to an embodiment of the invention, the common electrode surrounds a portion of the periphery of each of the pixel areas and fully overlaps, partially overlaps, or does not overlap with the scan line.

According to an embodiment of the invention, the step of forming the contact window which exposes the drain further includes forming the contact window in the first passivation layer above the drain.

According to an embodiment of the present invention, the pixel electrode has a plurality of slits.

The invention further provides a pixel structure, disposed on a substrate having a plurality of pixel areas arranged in an array, wherein the pixel structure is disposed in each of the pixel areas. The pixel structure includes a scan line, a gate electrode, a gate insulation layer, a semiconductor layer, a data line, a source and a drain, a first passivation layer, a common line, a common electrode, a second passivation layer, and a pixel electrode. The scan line and the gate electrode are disposed in each of the pixel areas. The gate insulation layer covers the scan line and the gate electrode. The semiconductor layer is disposed on the gate insulation layer above the gate electrode. The data line, the source, and the drain are disposed in each of the pixel areas. Moreover, the source and the drain are disposed on two sides of the semiconductor layer. The first passivation layer covers the data line, the source, and the drain. The common line is disposed on the first passivation layer and overlaps with at least a portion of the data line. The common electrode is disposed on and electrically connected with the common line. The second passivation layer covers the common electrode and the common line, wherein a contact window is located in the second passivation layer above the drain. The pixel electrode is disposed in each of the pixel areas and is electrically connected with the drain through the contact window.

According to an embodiment of the invention, the common electrode surrounds the periphery of each of the pixel areas.

According to an embodiment of the invention, the common electrode surrounds a portion of the periphery of each of the pixel areas and fully overlaps, partially overlaps, or does not overlap with the scan line.

According to an embodiment of the invention, the contact window is formed in the first passivation layer above the drain.

According to an embodiment of the invention, the pixel electrode has a plurality of slits.

According to an embodiment of the invention, the material of the common line includes chromium or molybdenum.

According to an embodiment of the invention, the material of the common electrode includes indium tin oxide or indium zinc oxide.

According to an embodiment of the invention, the materials of the scan line and the gate electrode include chromium, molybdenum, aluminum, or alloys thereof.

According to an embodiment of the invention, the material of the gate insulation layer includes silicon nitride or silicon oxide.

According to an embodiment of the invention, the material of the first passivation layer includes silicon nitride or silicon oxide.

According to an embodiment of the invention, the material of the semiconductor layer includes amorphous silicon or crystalline silicon.

According to an embodiment of the invention, the materials of the data line, the source, and the drain include chromium, molybdenum, aluminum, or alloys thereof.

According to an embodiment of the invention, the material of the second passivation layer includes silicon nitride or silicon oxide.

According to an embodiment of the invention, the material of the pixel electrode includes indium tin oxide or indium zinc oxide.

In light of the above, in the pixel structure of the invention, the common line is designed to partially overlap with the data line, so that the aperture ratio of the pixel structure is increased. Moreover, the common electrode which is electrically connected with the common line is formed on the common line, so that the electrical field formed between the common electrode and the pixel electrode drives the liquid crystals. Hence the pixel structure provides a wide viewing angle. Furthermore, since the common line and the scan line are not fabricated by the same photomask process, occurrence of a short circuit between the common line and the scan line is prevented, thereby increasing the production yield and enabling the pixel structure to have superb display quality.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In the invention, a number of photomask processes is increased, so that a loss of an aperture ratio caused by disposition of a common electrode is prevented. A pixel structure having a high aperture ratio and superb display quality is thereby fabricated. Particularly, since the common line and a scan line are not formed by the same photomask process, occurrence of a short circuit between the common line and the scan line is prevented.

Figure 2:
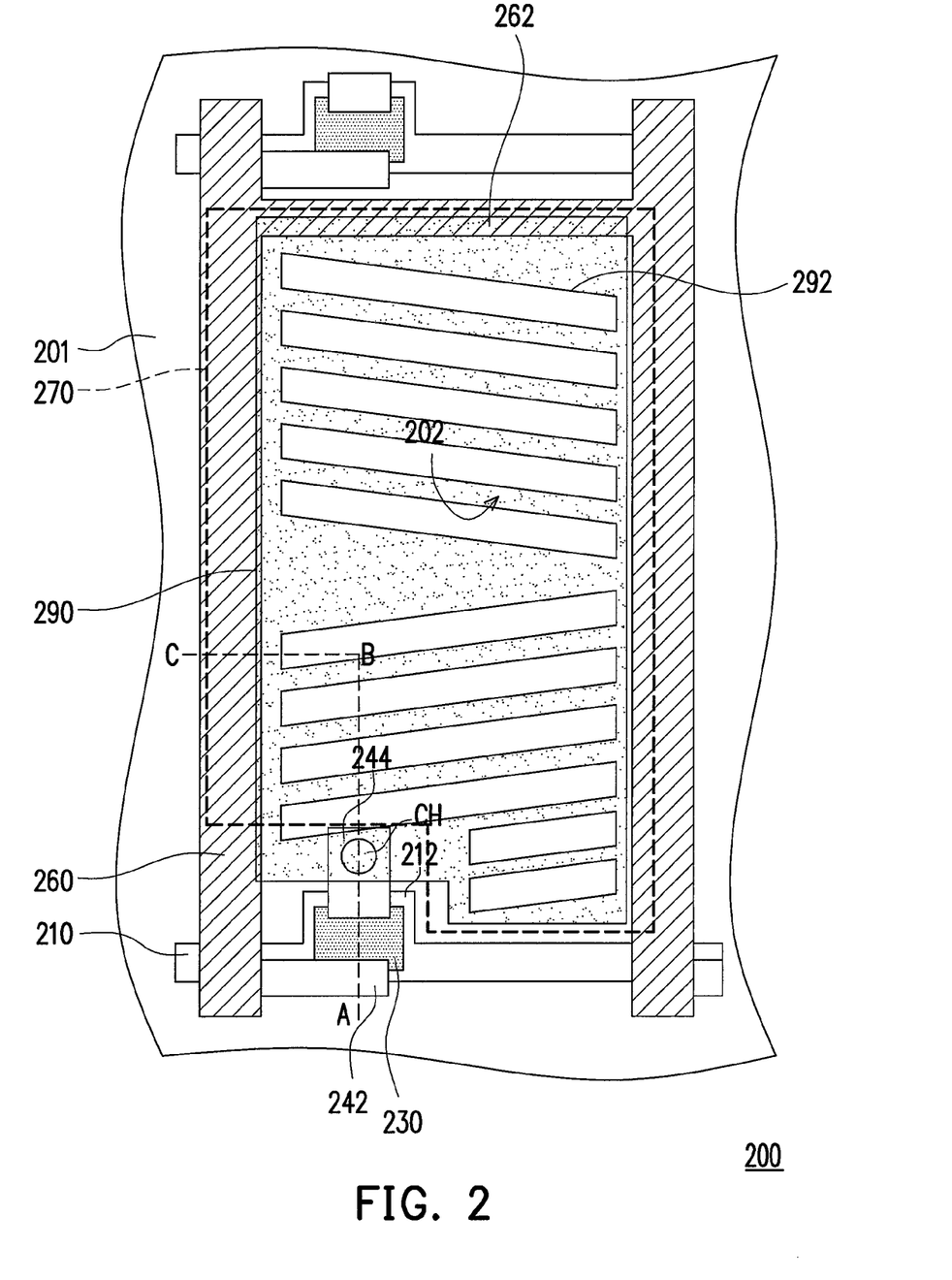
FIG. 2 is a schematic top view of a pixel structure according to an embodiment of the invention.
Figure 3A:
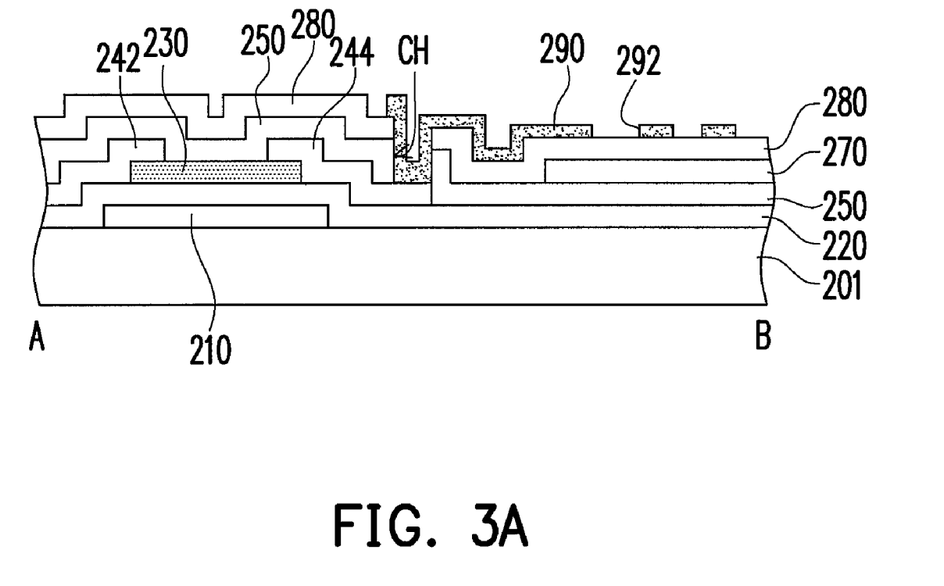
FIGS. 3A and 3B are schematic cross-sectional views along lines A-B and B-C in FIG. 2 respectively.
Figure 3B:
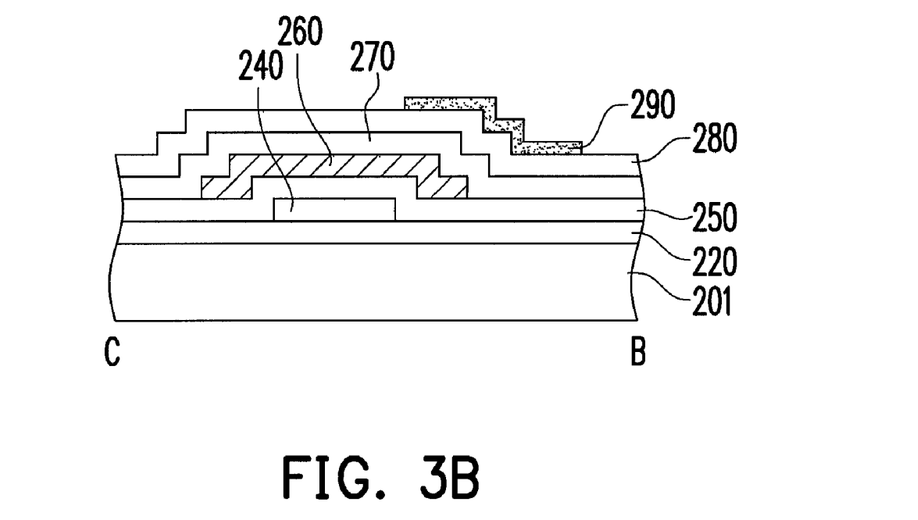

FIG. 2 is a schematic top view of a pixel structure according to an embodiment of the invention. FIGS. 3A and 3B are schematic cross-sectional views along lines A-B and B-C in FIG. 2 respectively.

Referring to all FIGS. 2, 3A, and 3B, a pixel structure 200 is disposed on a substrate 201. The substrate 201 includes a plurality of pixel areas 202 arranged in an array, and the pixel structure 200 is disposed in each of the pixel areas 202. In order to simplify the description, FIG. 2 only depicts one of the pixel areas 202. The pixel structure 200 includes a scan line 210, a gate 212, a gate insulating layer 220 (shown in FIGS. 3A and 3B), a semiconductor layer 230, a data line 240 (shown in FIG. 4D and covered by a common line 260 in FIG. 2), a source 242 and a drain 244, a first passivation layer 250 (shown in FIGS. 3A and 3B), common lines 260 and 262, a common electrode 270, a second passivation layer 280 (shown in FIGS. 3A and 3B), and a pixel electrode 290.

The scan line 210 and the gate electrode 212 are disposed in each of the pixel areas 202. The gate insulation layer 220 covers the scan line 210 and the gate electrode 212. The semiconductor layer 230 is disposed on the gate insulation layer 220 above the gate electrode 212. The data line 240, the source 242, and the drain 244 are disposed in each of the pixel areas 202. Moreover, the source 242 and the drain 244 are disposed on two sides of the semiconductor layer 230. The first passivation layer 250 covers the data line 240, the source 242, and the drain 244. The common lines 260 and 262 are disposed on the first passivation layer 250 and overlap with at least a portion of the data line 240. The common electrode 270 is disposed on and electrically connected with the common lines 260 and 262. The second passivation layer 280 covers the common electrode 270 and the common lines 260 and 262, wherein a contact window CH is formed in the second passivation layer 280 above the drain 244. The pixel electrode 290 is disposed in each of the pixel areas 202, and the pixel electrode 290 is electrically connected with the drain 244 through the contact window CH.

It should be noted that, although the common line 260 and the data line 240 completely overlap according to the present embodiment, the common line 260 and the data line 240 may partially overlap. In addition, according to an embodiment (not shown), the common lines 260 and 262 may overlap with both the data line 240 and the scan line 210 and may surround the periphery of each of the pixel areas 202. In the invention, since the common lines 260 and 262 at least partially overlap with the data line 240, the common lines 260 and 262 are prevented from shielding other areas of the pixel area 202, so that the aperture ratio of the pixel structure is increased.

Moreover, according to the present embodiment, the pixel electrode 290 has, for example, slits 292. The slits 292 are capable of adjusting a rotation angle of liquid crystals. Therefore, an electrical field formed between the common electrode 270 and the pixel electrode 290 is capable of further controlling the liquid crystals, so that the pixel structure 200 provides a wide viewing angle. Although the pixel electrode 290 is exemplarily used in the present embodiment, the invention does not limit the form of the pixel electrode, the number of the slits, or the arrangement of the slits. In other words, the pixel electrode 290 may have other forms known to one of ordinary skill in the art.

Materials and film thicknesses of the elements of the pixel structure 200 are described in the following embodiments. The materials of the scan line 210 and the gate electrode 212 may be a metal or an alloy, such as chromium, molybdenum, aluminum, or alloys thereof, and the thicknesses of the scan line 210 and the gate electrode 212 are from 2,250 Å to 2,750 Å. The material of the gate insulation layer 220 is an insulating material, such as silicon nitride or silicon oxide, and the thickness of the gate insulation layer 220 is from 3,600 Å to 4,400 Å. The material of the semiconductor layer 230 is, for example, amorphous silicon or crystalline silicon, and a thickness of the semiconductor layer 230 is from 1,800 Å to 2,200 Å. According to an embodiment (not shown), the semiconductor layer 230 includes a channel layer (not shown) and an ohmic contact layer (not shown), for instance. The channel layer (not shown) may be disposed on the gate insulation layer 220 above the gate electrode 212, and the ohmic contact layer (not shown) is disposed on the channel layer. The materials of the data line 240, the source 242, and the drain 244 may be a metal or an alloy, such as chromium, molybdenum, aluminum, or alloys thereof, and the thicknesses of the data line 240, the source 242, and the drain 244 are from 2,250 Å to 2,750 Å. The material of the first passivation layer 250 is, for example, silicon nitride, and a thickness of the first passivation layer 250 is from 4,500 Å to 5,500 Å.

The materials of the common lines 260 and 262 may be a metal or an alloy, such as chromium, molybdenum, aluminum, or alloys thereof, and the thicknesses of the common lines 260 and 262 are from 2,250 Å to 2,750 Å. The material of the common electrode 270 may be a transparent conductive material, such as indium tin oxide or indium zinc oxide, and the thickness of the common electrode 270 is from 900 Å to 1,100 Å. The material of the second passivation layer 280 is, for example, silicon nitride, and the thickness of the second passivation layer 280 is from 2,700 Å to 3,300 Å. The material of the pixel electrode 290 may be a transparent conductive material, such as indium tin oxide or indium zinc oxide, and the thickness of the pixel electrode 290 is from 900 Å to 1,100 Å.

It should be noted that in this embodiment, the common electrode 270 is formed by a transparent conductive material. Therefore, the portion covered by the common electrode 270 does not have much influence on the aperture ratio of the pixel structure 200, and the common electrode 270 may occupy a large area in the pixel area 202. In addition, since the common electrode 270 is electrically connected with the common lines 260 and 262, so that although the common electrode 270 is formed by the transparent conductive material having lower conductivity, the common electrode 270 still has good electrical characteristics due to the fact that the common lines 260 and 262 are formed by metals having high conductivity. The electrical field formed between the common electrode 270 and the pixel electrode 290 is thereby used to drive the liquid crystals. In other words, the pixel structure 200 has both superb display quality and a higher aperture ratio.

According to the present embodiment, the common line 260 is disposed above and overlaps with the data line 240. The common lines 260 and 262 surround, for example, a portion of the periphery of each of the pixel areas 202, so that light passing through the center of the pixel area 202 is not shielded by the common lines 260 and 262. Hence the pixel structure 200 has a higher aperture ratio. According to an embodiment, the aperture ratio of the pixel structure 200 is up to about 67%. Hence the pixel structure 200 is especially suitable for middle to small sized displays which require a high aperture ratio, so that needs for light source brightness in the displays are reduced, thereby achieving the purpose of saving electricity.

Moreover, according to the present embodiment, the common electrode 270 is electrically connected with and formed on the common lines 260 and 262, so that the electrical field formed between the common electrode 270 and the pixel electrode 290 drives the liquid crystals. Hence the pixel structure 200 provides a wide viewing angle. Therefore, compared with fringe field switching (FFS), the pixel structure 200 having a wide viewing angle has a high aperture ratio, so that the pixel structure is more suitable for middle to small sized displays used in portable electronic products. Furthermore, although the common lines 260 and 262 are first formed, and then the common electrode 270 is formed according to the present embodiment, the common electrode 270 may be formed before forming the common lines 260 and 262 according to another embodiment. The above advantages are still achievable. Additionally, since the common line 262 and the scan line 210 are not fabricated by the same photomask process, occurrence of a short circuit between the common line 262 and the scan line 210 is prevented, thereby increasing the production yield and enabling the pixel structure 200 to have superb display quality.

The following describes a fabricating method of the above pixel structure 200.

FIGS. 4A to 4H are schematic top views illustrating a fabricating method of a pixel structure according to an embodiment of the invention. In order to simplify the description, only one pixel area is depicted in the drawings.

Figure 4A:
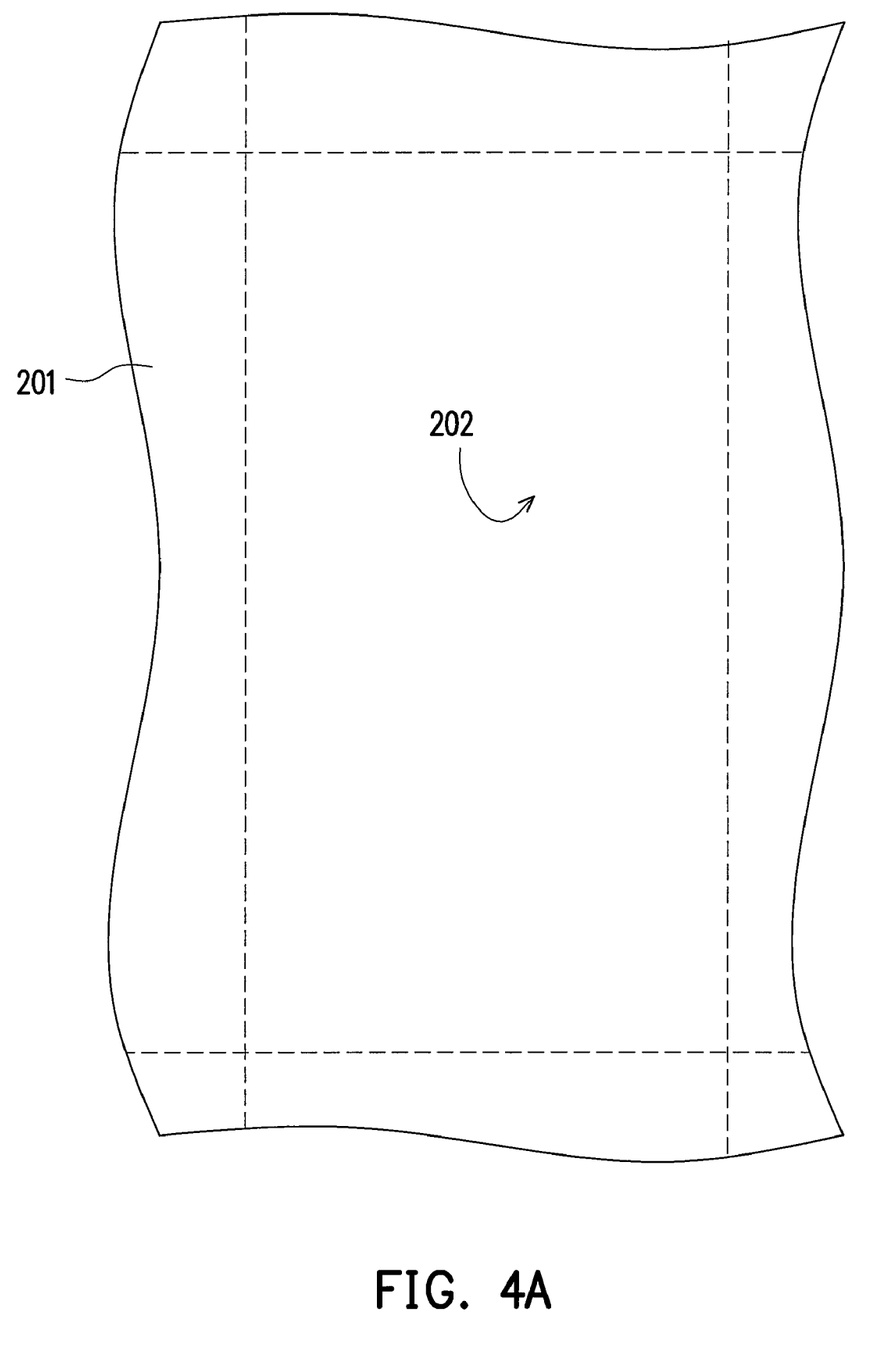
FIGS. 4A to 4H are schematic top views illustrating a fabricating method of a pixel structure according to an embodiment of the invention.

First, referring to FIG. 4A, the substrate 201 having the plurality of pixel areas 202 arranged in an array is provided.

Figure 4B:
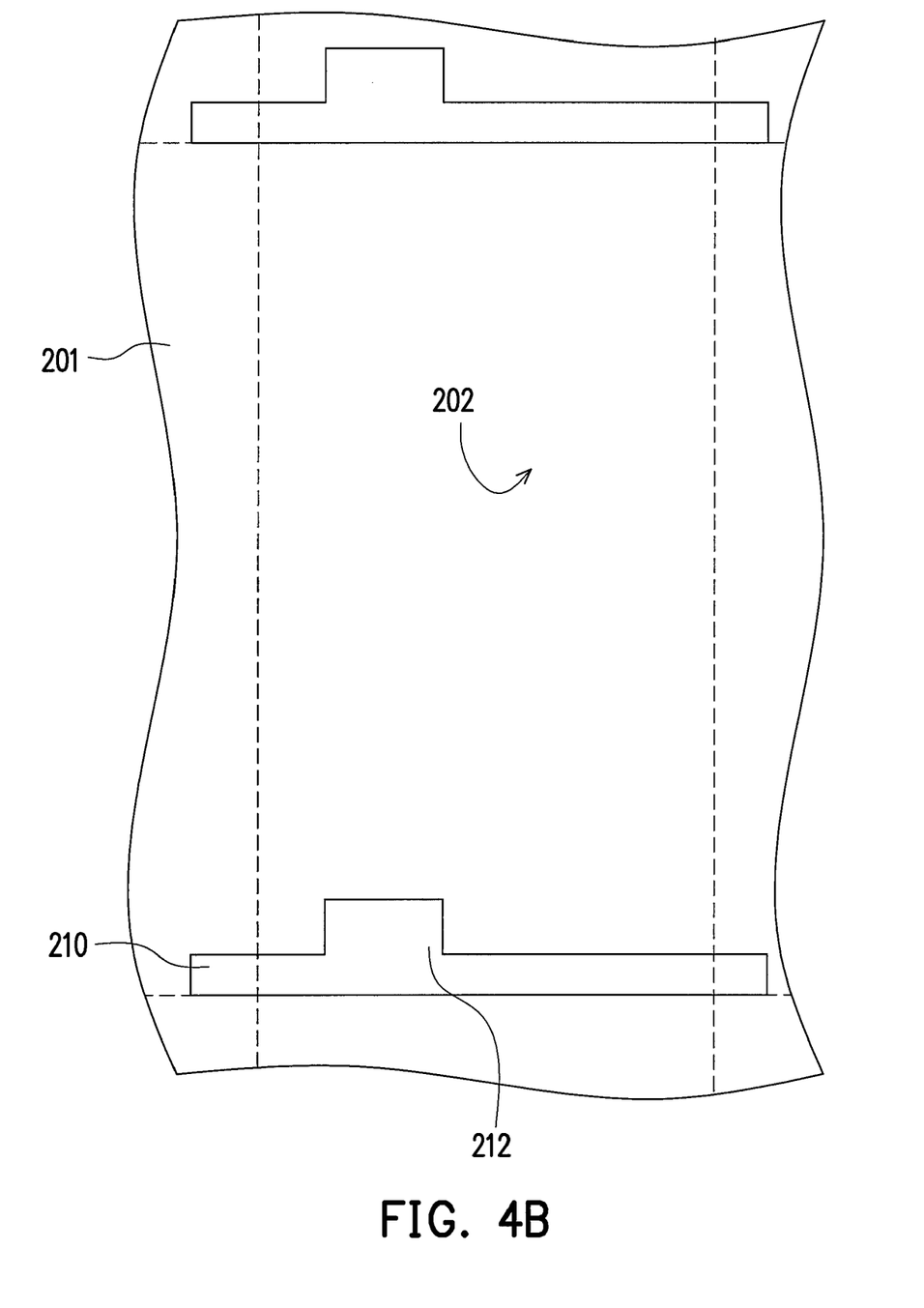

Next, referring to FIG. 4B, the scan line 210 and the gate electrode 212 are formed in each of the pixel areas 202.

Then, the gate insulation layer 220, as shown in FIGS. 3A and 3B, is formed completely over the substrate 201 to cover the scan line 210 and the gate electrode 212.

Figure 4C:
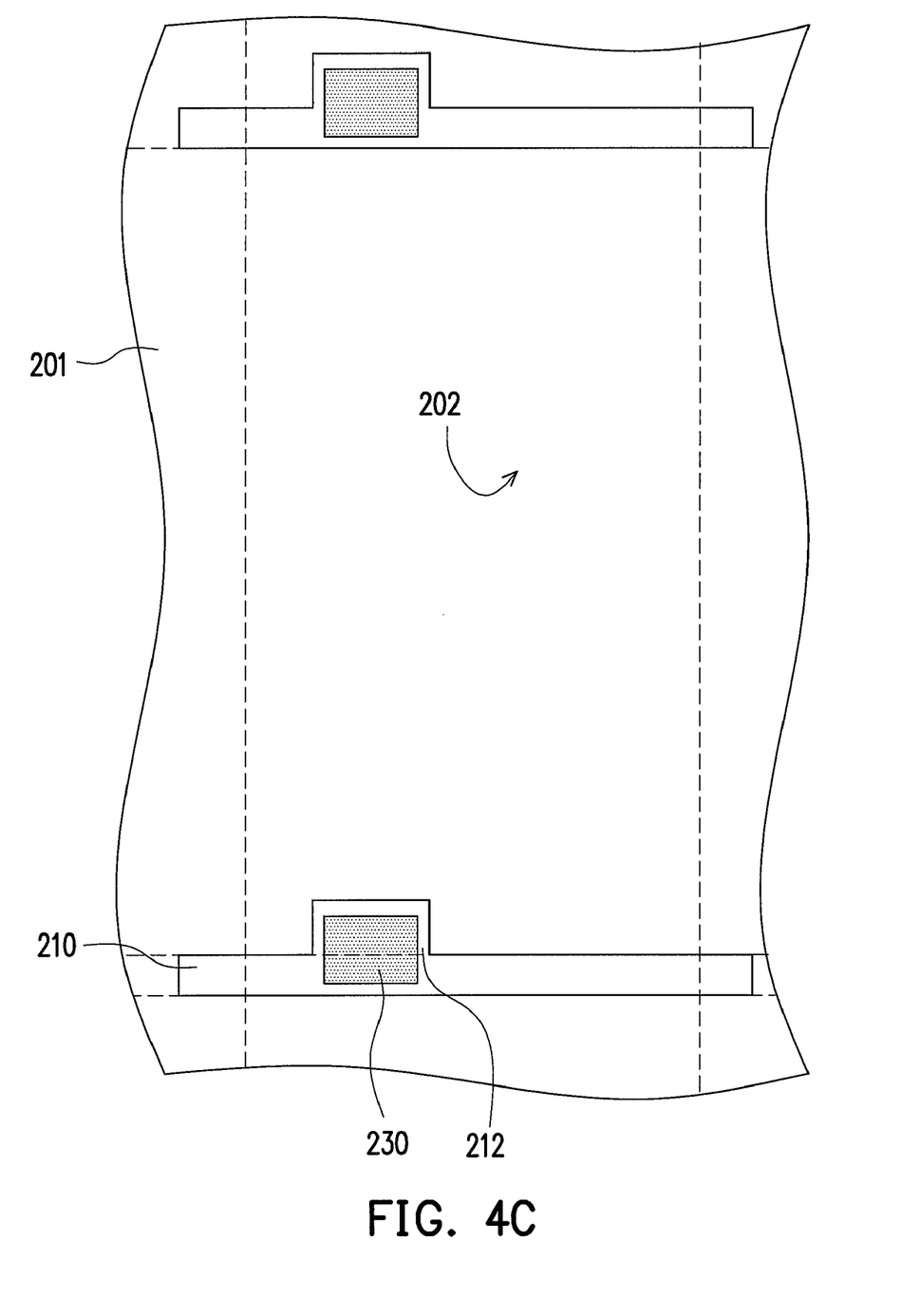

Afterwards, referring to FIG. 4C, the semiconductor layer 230 is formed on the gate insulation layer 220 above the gate electrode 212. The fabricating method of the semiconductor layer 230 is, for example, forming a channel layer (not shown) on the gate insulation layer 220 above the gate electrode 212, and then forming an ohmic contact layer (not shown) on the channel layer.

Figure 4D:
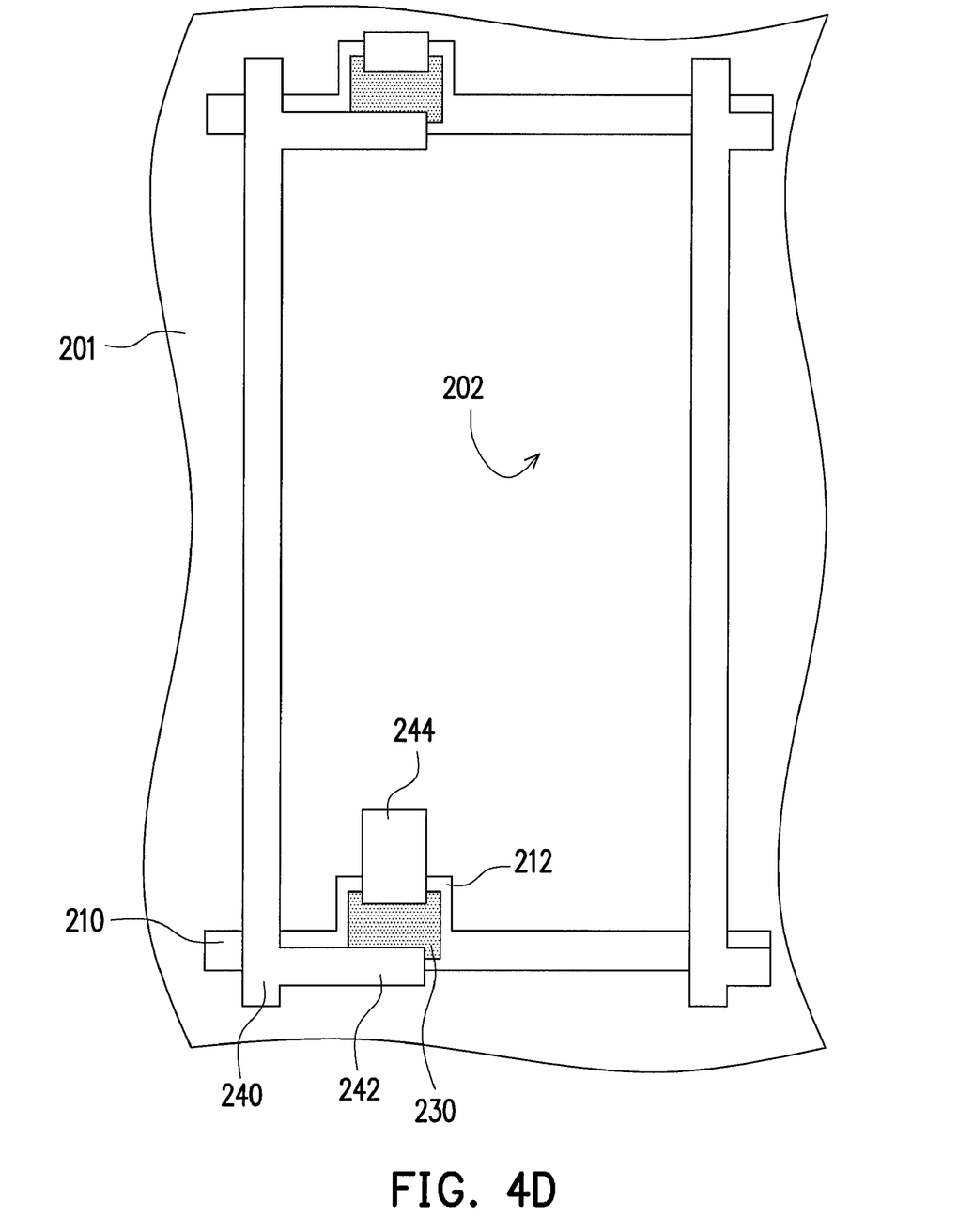

Thereafter, referring to FIG. 4D, the data line 240, the source 242, and the drain 244 are formed in each of the pixel areas 202. The source 242 and the drain 244 are formed on two sides of the semiconductor layer 230.

The first passivation layer 250 is formed completely over the substrate 201, as shown in FIGS. 3A and 3B, so as to cover the data line 240, the source 242, and the drain 244.

Figure 4E:
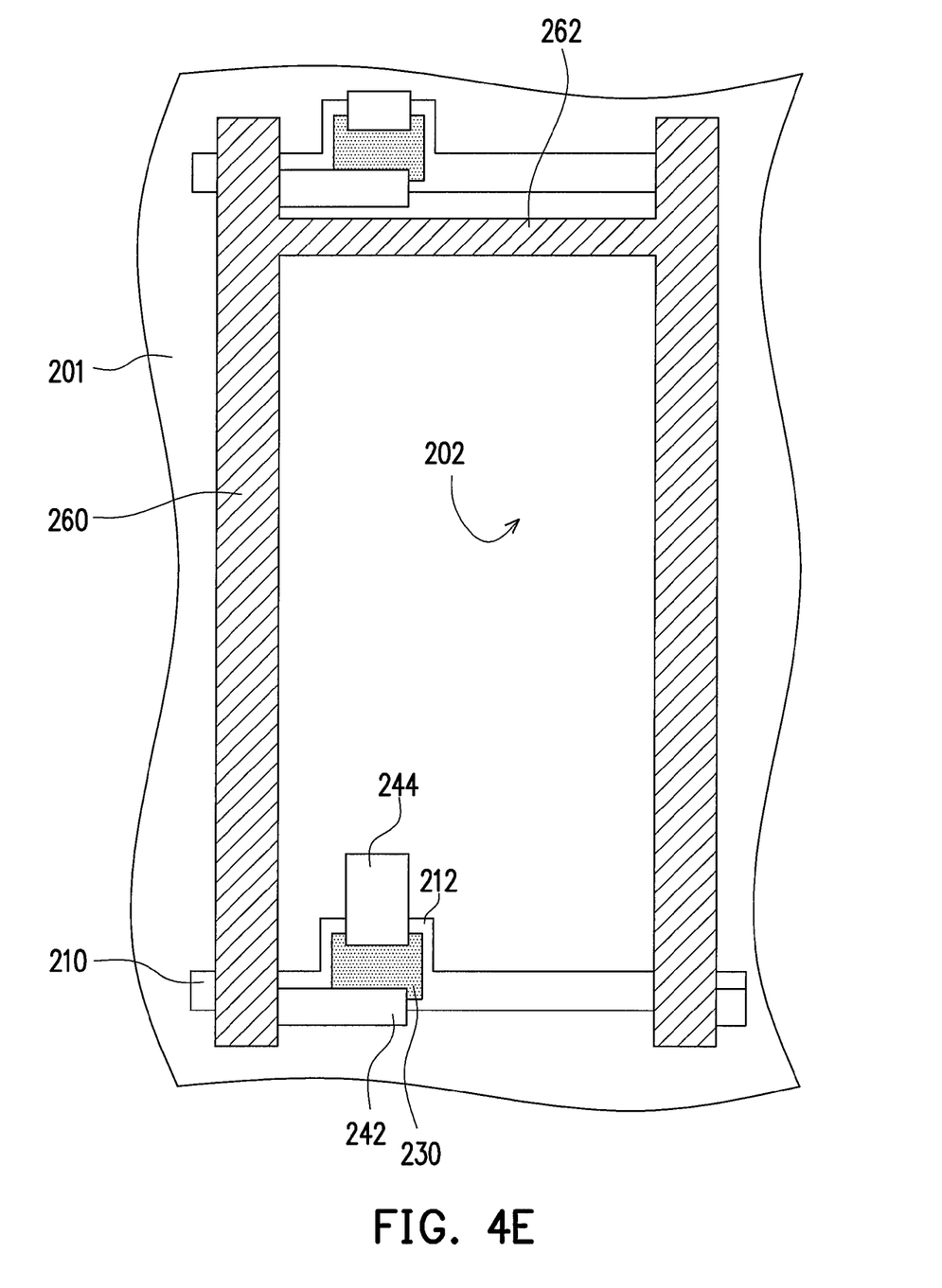

Referring to FIG. 4E, the common lines 260 and 262 are then formed on the first passivation layer 250. The common lines 260 and 262 at least partially overlap with the data line 240. According to the present embodiment, the common lines 260 and 262 surround, for example, the periphery of each of the pixel areas 202 and do not overlap with the scan line 210. According to another embodiment, the common line 262 may partially or fully overlap (not shown) with the scan line 210. The fabricating method of the common lines 260 and 262 is, for example, forming a metal layer (not shown) completely over the substrate 201 and then patterning the metal layer by photolithography and etching processes.

Figure 4F:
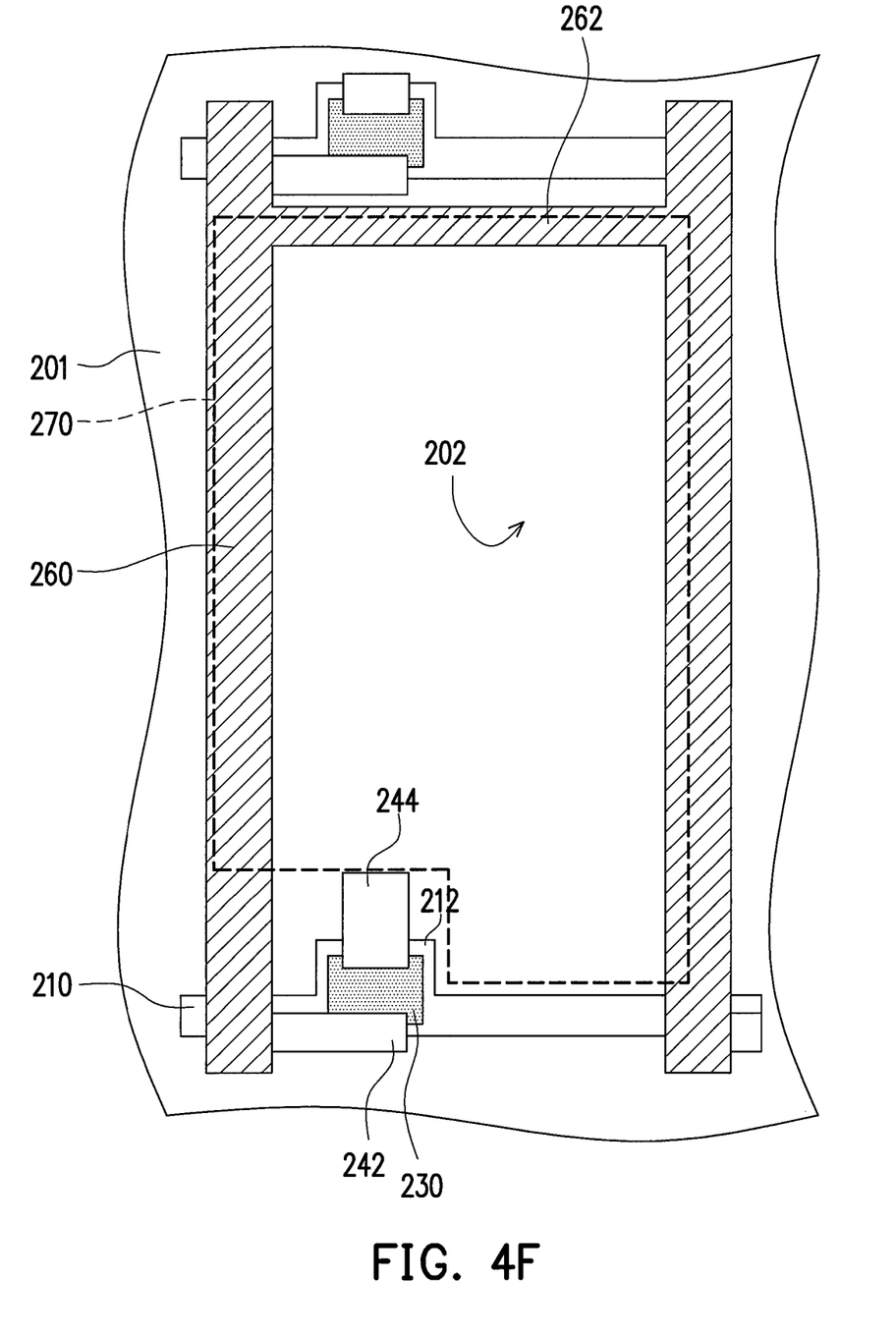

Next, referring to FIG. 4F, the common electrode 270 is formed on and electrically connected with the common lines 260 and 262. The fabricating method of the common electrode 270 is, for instance, forming a transparent conductive layer (not shown) completely over the substrate 201 by a sputtering process, and patterning the transparent conductive layer by photolithography and etching processes. It should be noted that according to another embodiment, the common electrode 270 may be formed before forming the common lines 260 and 262.

Then, the second passivation layer 280 is formed completely over the substrate 201, as shown in FIGS. 3A and 3B, so as to cover the common electrode 270 and the common lines 260 and 262.

Figure 4G:
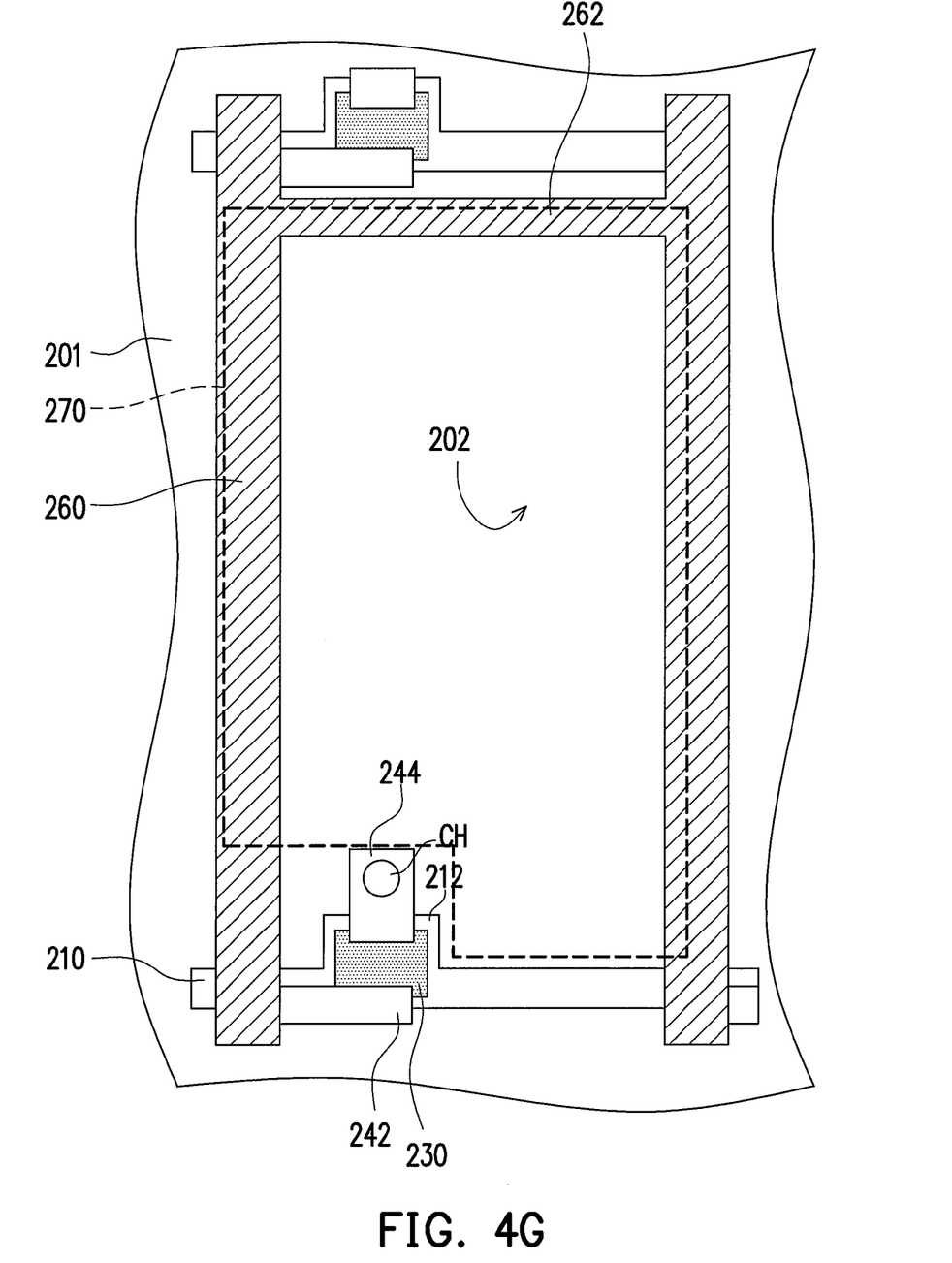

Following that, referring to FIG. 4G, the contact window CH is formed in the second passivation layer 280 above the drain 244, so as to expose the drain 244 (please also refer to FIGS. 3A and 3B). According to the present embodiment, the fabricating method of the contact window CH is, for instance, sequentially etching the second passivation layer 280 and the first passivation layer 250, so as to expose the drain 244, thereby forming the contact window CH in the second passivation layer 280 and the first passivation layer 250.

Figure 4H:
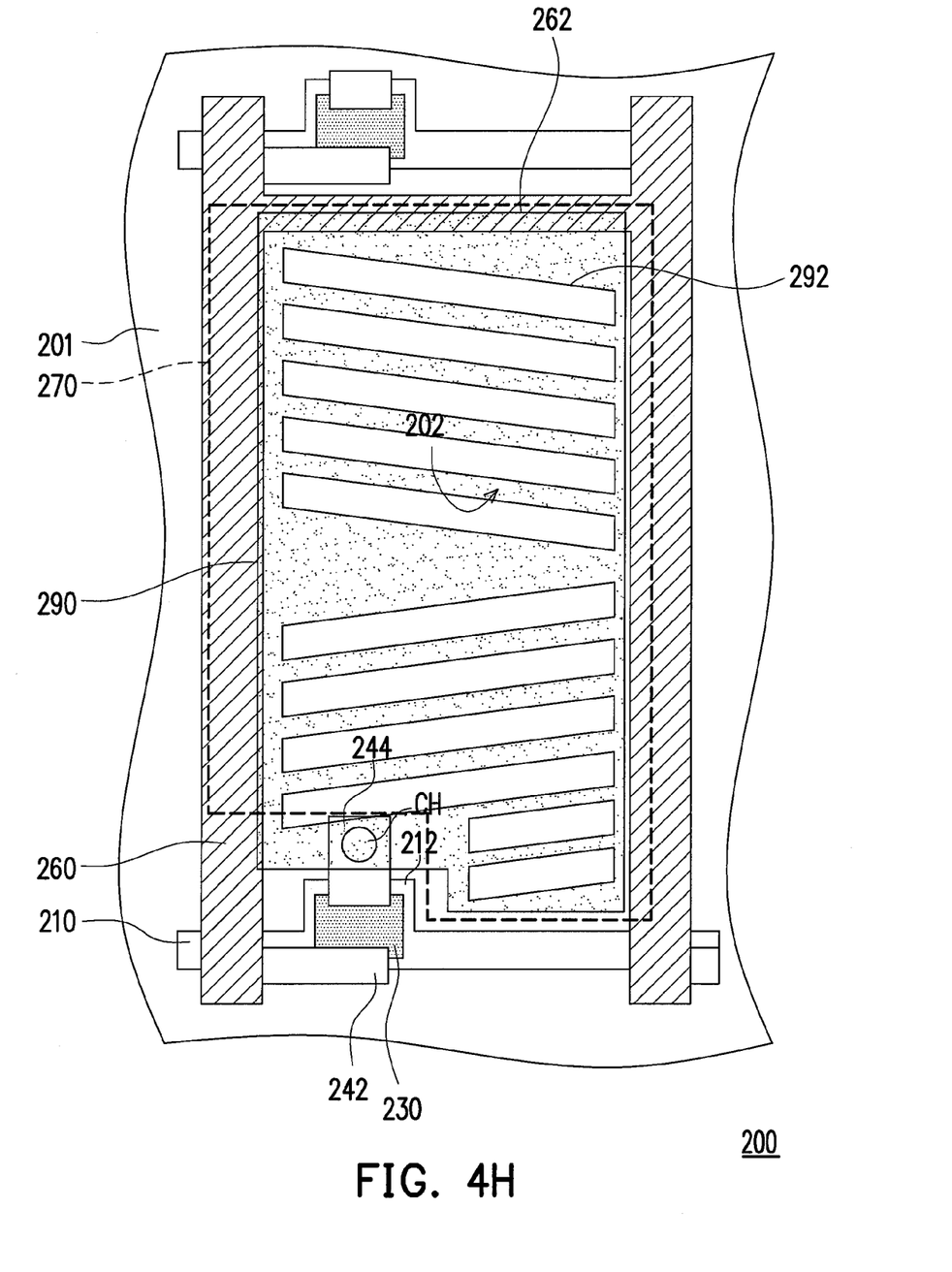

Further to the above, referring to all FIGS. 4H, 3A, and 3B, the pixel electrode 290 (represented by dashed lines in FIG. 4H) is formed in each of the pixel areas 202. The pixel electrode 290 is electrically connected with the drain 244 through the contact window CH. Accordingly, the fabrication of the pixel structure 200 is completed.

Compared with the conventional fabricating methods, steps of forming the common lines 260 and 262 and the common electrode 270 are added to the fabricating method of the pixel structure according to the present embodiment. In other words, seven photomask processes are used to fabricate the pixel structure 200 according to the present embodiment.

It should be noted that the common line 262 and the scan line 210 are not formed by the same photomask process, so that occurrence of a short circuit between the common line 262 and the scan line 210 is prevented.

In summary, in the pixel structure of the invention, the common line is designed to partially overlap with the data line, so that the aperture ratio of the pixel structure is increased, thereby reducing energy consumption. Moreover, the common electrode which is electrically connected with the common line is formed on the common line, so that the electrical field formed between the common electrode and the pixel electrode drives the liquid crystals. Hence the pixel structure provides a wide viewing angle.

Compared with the conventional technology, the fabricating method of the pixel structure of the invention includes one to two additional photomask processes. That is, in the method, additional photomask processes are carried out to form the common line and the common electrode. In particular, since the common line and the scan line are not fabricated by the same photomask process, occurrence of a short circuit between the common line and the scan line is prevented, thereby increasing the production yield and enabling the pixel structure to have superb display quality.

Although the invention has been described with reference to the embodiments thereof, it will be apparent to one of the ordinary skills in the art that modifications to the described embodiments may be made without departing from the spirit of the invention. Accordingly, the scope of the invention will be defined by the attached claims not by the above detailed description.

What is claimed is:

1. A fabricating method of a pixel structure, comprising:
providing a substrate, having a plurality of pixel areas arranged in an array;
forming a scan line and a gate electrode in each of the pixel areas;
forming a gate insulation layer, covering the scan line and the gate electrode;
forming a semiconductor layer on the gate insulation layer above the gate electrode;
forming a data line, a source, and a drain in each of the pixel areas, the source and the drain being formed on two sides of the semiconductor layer;
forming a first passivation layer on the substrate, the first passivation layer covering the data line, the source, and the drain;
forming a common line on the first passivation layer, the common line overlapping with at least a portion of the data line;
forming a common electrode on the common line, the common electrode being electrically connected with the common line;
forming a second passivation layer, covering the common electrode and the common line;
forming a contact window in the second passivation layer above the drain, the contact window exposing the drain; and
forming a pixel electrode in each of the pixel areas, the pixel electrode being electrically connected with the drain through the contact window.

2. The fabricating method of the pixel structure of claim 1, wherein the common line surrounds a periphery of each of the pixel areas.

3. The fabricating method of the pixel structure of claim 1, wherein the common line surrounds a portion of a periphery of each of the pixel areas, and fully overlaps, partially overlaps, or does not overlap with the scan line.

4. The fabricating method of the pixel structure of claim 1, wherein the step of forming the contact window which exposes the drain further comprises forming the contact window in the first passivation layer above the drain.

5. The fabricating method of the pixel structure of claim 1, wherein the pixel electrode has a plurality of slits.

6. A pixel structure, disposed on a substrate having a plurality of pixel areas arranged in an array, the pixel structure being disposed in each of the pixel areas, the pixel structure comprising:
a scan line and a gate electrode, disposed in each of the pixel areas;
a gate insulation layer, covering the scan line and the gate electrode;
a semiconductor layer, disposed on the gate insulation layer above the gate electrode;
a data line, a source, and a drain, disposed in each of the pixel areas, the source and the drain being disposed on two sides of the semiconductor layer;
a first passivation layer, covering the data line, the source, and the drain;
a common line, disposed on the first passivation layer and overlapping with at least a portion of the data line;

a common electrode, disposed on and electrically connected with the common line;

a second passivation layer, covering the common electrode and the common line, wherein a contact window is located in the second passivation layer above the drain; and a pixel electrode, disposed in each of the pixel areas, the pixel electrode being electrically connected with the drain through the contact window.

7. The pixel structure of claim 6, wherein the common line surrounds a periphery of each of the pixel areas.

8. The pixel structure of claim 6, wherein the common line surrounds a portion of a periphery of each of the pixel areas, and fully overlaps, partially overlaps, or does not overlap with the scan line.

9. The pixel structure of claim 6, wherein the contact window is formed in the first passivation layer above the drain.

10. The pixel structure of claim 6, wherein the pixel electrode has a plurality of slits.

11. The pixel structure of claim 6, wherein a material of the common line comprises chromium or molybdenum.

12. The pixel structure of claim 6, wherein a material of the common electrode comprises indium tin oxide or indium zinc oxide.

13. The pixel structure of claim 6, wherein materials of the scan line and the gate electrode comprise chromium, molybdenum, aluminum, or alloys thereof.

14. The pixel structure of claim 6, wherein a material of the gate insulation layer comprises silicon nitride or silicon oxide.

15. The pixel structure of claim 6, wherein a material of the first passivation layer comprises silicon nitride or silicon oxide.

16. The pixel structure of claim 6, wherein a material of the semiconductor layer comprises amorphous silicon or crystalline silicon.

17. The pixel structure of claim 6, wherein materials of the data line, the source, and the drain comprise chromium, molybdenum, aluminum, or alloys thereof.

18. The pixel structure of claim 6, wherein a material of the second passivation layer comprises silicon nitride or silicon oxide.

19. The pixel structure of claim 6, wherein a material of the pixel electrode comprises indium tin oxide or indium zinc oxide.

* * * * *